United States Patent
Li

(10) Patent No.: US 9,634,570 B2
(45) Date of Patent: Apr. 25, 2017

(54) MULTI-MODE POWER CONVERTER AND ASSOCIATED CONTROL METHOD

(71) Applicant: Chengdu Monolithic Power Systems Co., Ltd., Chengdu (CN)

(72) Inventor: Yike Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 14/948,066

(22) Filed: Nov. 20, 2015

(65) Prior Publication Data

US 2016/0149494 A1    May 26, 2016

(30) Foreign Application Priority Data

Nov. 25, 2014 (CN) .......................... 2014 1 0690156

(51) Int. Cl.
*H02M 3/158* (2006.01)
*H03K 17/06* (2006.01)

(52) U.S. Cl.
CPC .... *H02M 3/1582* (2013.01); *H03K 2017/066* (2013.01); *H03K 2217/0018* (2013.01)

(58) Field of Classification Search
CPC .... H02M 3/156; H02M 3/158; H02M 3/1582; H02M 3/1588; G05F 1/24
See application file for complete search history.

(56) References Cited

U.S. PATENT DOCUMENTS

| | | | | |
|---|---|---|---|---|
| 5,929,615 A * | 7/1999 | D'Angelo | ............... | G05F 1/618 323/222 |
| 9,007,040 B2 * | 4/2015 | Ikeda | ................... | H02M 3/158 323/222 |
| 2015/0048810 A1* | 2/2015 | Terui | ..................... | H02M 3/155 323/271 |
| 2015/0194888 A1* | 7/2015 | Kasai | .................... | H02M 3/158 323/271 |
| 2015/0303803 A1* | 10/2015 | Chen | ..................... | H02M 3/158 323/271 |
| 2016/0065066 A1* | 3/2016 | Zhang | .................. | H02M 3/158 323/271 |
| 2016/0105109 A1* | 4/2016 | Jasim | .................... | H02M 3/155 323/271 |
| 2016/0118825 A1* | 4/2016 | Yoshida | ............... | H02J 7/0052 323/271 |
| 2016/0294285 A1* | 10/2016 | Le Men | ............... | H02M 3/1582 |

* cited by examiner

*Primary Examiner* — Gary L Laxton
(74) *Attorney, Agent, or Firm* — Perkins Coie LLP

(57) ABSTRACT

A multi-mode power converter and associated method for configuring and controlling a multi-mode power converter. The multi-mode power converter may have a boost operation mode and a buck operation mode. A first transistor is coupled between a switching terminal and a ground, and a second transistor and a third transistor are coupled in series between the switching terminal and an output port of the multi-mode power converter. In the buck mode, an on-resistance of the second transistor is regulated to ensure the multi-mode power converter to operate normally in the buck operation mode.

17 Claims, 6 Drawing Sheets

MULTI-MODE POWER CONVERTER AND ASSOCIATED CONTROL METHOD

CROSS-REFERENCE TO RELATED APPLICATION

This application claims the benefit of Chinese Patent Application No. 201410690156.7, filed on Nov. 25, 2014, which is incorporated herein by reference in its entirety.

TECHNICAL FIELD

The present invention relates generally to electrical circuits, and more particularly but not exclusively to multi-mode switching power converter and the associated control method.

BACKGROUND

Switching mode power converter is a type of commonly used voltage converter circuit which is generally configured to provide load with regulated output voltage or current (i.e., load voltage or load current) based on unregulated supply voltage.

FIG. 1 shows a circuit diagram of a prior art boost converter circuit 10. The converter circuit 10 comprises: a first inductor L1, a first transistor M1, a second transistor M2, and an output capacitor CO. The first inductor L1 is coupled between an input terminal IN and a switching terminal SW; the first transistor M1 is coupled between the switching terminal SW and a ground terminal GND; the second transistor M2 is coupled between the switching terminal SW and an output terminal OUT; and the output capacitor CO is coupled between the output terminal OUT and the ground terminal GND. The second transistor M2 can be a P-type channel metal oxide semiconductor field effect transistor ("PMOS"). When the converter 10 is disabled, voltage at the input terminal voltage (i.e. an input voltage VIN) and voltage at the switching terminal (i.e. a switching voltage VSW) are higher than voltage at the output terminal (i.e. an output voltage VOUT), and a body of the second transistor M2 should be coupled to the switching terminal SW to prevent the body diode D1 from being turned ON. When the converter circuit 10 is enabled and the first transistor M1 is turned ON, the switching voltage VSW is close to zero and substantially lower than the output voltage VOUT. In this circumstance, the body of the second transistor M2 should be coupled to the output terminal OUT of converter circuit 10 to prevent the body diode D2 from being turned ON. Therefore, a body selection circuit 101 is needed in converter circuit 10 to selectively couple the body of the second transistor M2 to a high electric potential terminal of converter circuit 10 in different conditions. Usually, such a body selection circuit 101 has very complex circuit configuration and control logic, which is hard to design, prone to design mistakes and resulting in large layout size. Moreover, the cost performance of technical proposals adopting body selection circuit is especially low when the load current of the converter circuit 10 is relatively small (i.e., an on-resistance of the transistor M2 can be relatively high with a small layout area). As a result, design of more optimized circuit structure to avoid using a body selection circuit in boost converter circuit is a challenge faced by persons skilled in the art. In addition, the boost converter circuit 10 as shown in FIG. 1 can only provide an output voltage VOUT higher than the input voltage VIN. Optimizing the circuit so that it can also provide an output voltage VOUT lower than the input voltage VIN is another challenge faced by persons skilled in the art.

SUMMARY

To solve one or more of the problems described above, there has been provided, in accordance with an embodiment of the present disclosure, a multi-mode power converter. The multi-mode power converter may have a boost operation mode and a buck operation mode and may comprise an inductive element coupled between an input port and a switching terminal, a first transistor coupled between the switching terminal and a ground, a second and a third transistor coupled in series between the switching terminal and the output port. When the multi-mode power converter operates in the boost operation mode, the second transistor is ON while the first transistor and the third transistor are switched ON and OFF complementarily, or the second transistor and the third transistor are switched ON and OFF substantially simultaneously while the first transistor and the third transistor are switched ON and OFF complementarily. When the multi-mode power converter operates in the buck operation mode, the second transistor is ON while the first transistor and the third transistor are switched ON and OFF complementarily, and wherein an on-resistance of the second transistor is regulated to ensure the multi-mode power converter operates normally in the buck operation mode.

The multi-mode power converter may further comprise an impedance control circuit for regulating the on-resistance of the second transistor. The impedance control circuit may be configured to sense a switching voltage at the switching terminal to provide a sensed switching voltage, and identify whether the sensed switching voltage is lower than a reference signal after a first time period since the moment when the first transistor is switched OFF. If the sensed switching voltage is lower than the reference signal after the first time period since the moment when the first transistor is switched OFF, the impedance control circuit is further configured to regulate the on-resistance of the second transistor to increase.

There has also been provided, in accordance with an embodiment of the present disclosure, a method for controlling a multi-mode power converter having a boost operation mode and a buck operation mode. The method may comprise: coupling a switching terminal of the multi-mode power converter to an input port through an inductive element; coupling a first transistor between the switching terminal and a ground; coupling a second transistor and a third transistor in series between the switching terminal and an output port; in the boost operation mode, keeping the second transistor ON while switching the first transistor and the third transistor ON and OFF complementarily, or switching the second transistor and the third transistor ON and OFF substantially simultaneously while switching the first transistor and the third transistor ON and OFF complementarily; and in the buck operation mode, keeping the second transistor ON while switching the first transistor and the third transistor ON and OFF complementarily and regulating an on-resistance of the second transistor to ensure the multi-mode power converter operates normally in the buck operation mode.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Figure 1:
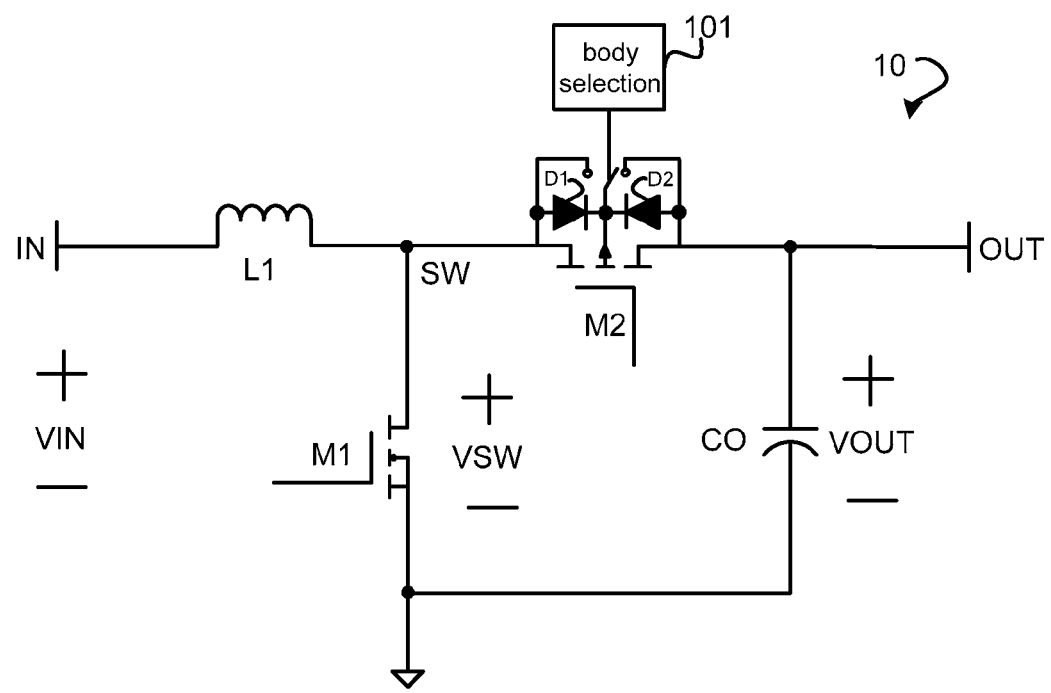
FIG. 1 shows a circuit diagram of a prior art boost converter circuit 10.
Figure 2:
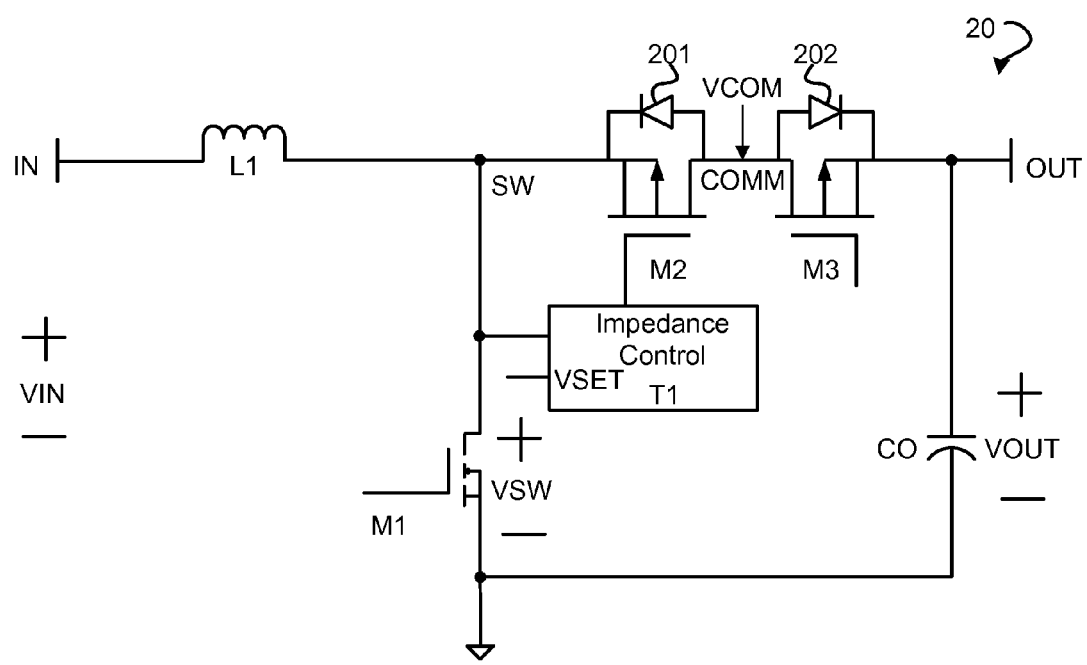
FIG. 2 shows a circuit diagram of a multi-mode power converter 20 according to an embodiment of the present invention.

FIG. 2 shows a circuit diagram of a multi-mode power converter 20 according to an embodiment of the present invention. The multi-mode power converter 20 may comprise an inductive element (e.g. a first inductor) L1, a first transistor M1, a second transistor M2, and a third transistor M3. The first inductor L1 is coupled between an input terminal IN and a switching terminal SW. The first transistor M1 is coupled between the switching terminal SW and a ground terminal GND. The second transistor M2 and the third transistor M3 may both comprise P-type channel metal oxide semiconductor field effect transistors ("PMOS"), coupled between the switching terminal SW and an output terminal OUT in series, wherein a body of the second transistor M2 is coupled to the switching terminal SW (e.g. in FIG. 1, a cathode of a body diode 201 of the second transistor M2 is coupled to the switching terminal SW and an anode of the body diode 201 is coupled to a common terminal COMM), and wherein a body of the third transistor M3 is coupled to the output terminal OUT (e.g. in FIG. 1, a cathode of a body diode 202 of the third transistor M3 is coupled to the output terminal OUT and an anode of the body diode 202 is coupled to the common terminal COMM).

When the multi-mode power converter 20 is disabled, the second transistor M2 and the third transistor M3 are turned OFF, and a switching voltage VSW at the switching terminal SW is higher than an output voltage VOUT at the output terminal OUT. Thus, the body diode 201 of the second transistor M2 blocks a current from flowing from the switching terminal SW to the output terminal OUT.

When the multi-mode power converter 20 is enabled and operates in boost mode, the second transistor M2 can operate in multiple modes. In one embodiment, the second transistor M2 can operate in a conduction mode (i.e., the second transistor M2 keeps ON during a whole switching cycle), in which, the first transistor M1 and the third transistor M3 form a switch group, wherein the first transistor M1 is turned ON and the third transistor M3 is turned OFF during a first half of the switching cycle, and wherein the first transistor M1 is turned OFF and the third transistor M3 is turned ON during a second half of the switching cycle. In this situation, the operating principle of the multi-mode power converter 20 is similar to that of the prior art converter circuit 10 as shown in FIG. 1. In another embodiment, the second transistor M2 can operate in a switching mode, in which the second transistor M2 can have the substantially same switching status as the third transistor M3. For example, during the first half of the switching cycle, the first transistor M1 is turned ON and the second transistor M2 and the third transistor M3 are turned OFF, and during the second half of the switching cycle, the first transistor M1 is turned OFF and the second transistor M2 and the third transistor M3 are turned ON. In this situation, the operating principle of the multi-mode power converter 20 is still similar to that of the prior art converter circuit 10 as shown in FIG. 1.

Multi-mode power converter 20 can also operate in buck mode. When the converter 20 is in buck mode, an on-resistance of the second transistor M2 is adjustable. The on-resistance is "adjustable" in that adjusting the resistance of the second transistor M2 in conduction status initiatively, rather than meaning the resistance of the second transistor M2 switches from infinitely great (at least several mega ohms) to the lowest (resistance during fully conduction) during ON/OFF switching, or the on-resistance of the second transistor M2 changes due to source-drain voltage fluctuation passively. The on-resistance of the second transistor M2 can change continuously, for example, varying from 0.1 ohm to 1 ohm continuously or take on step or discontinuous changes, for example, changing from 0.1 ohm to 0.5 ohm and finally to 1 ohm.

In an embodiment, when the multi-mode power converter 20 operates in buck mode, the second transistor M2 is ON while the first transistor and the third transistor are switched ON and OFF complementarily. For example, during the first half of the switching cycle, the first transistor M1 and the second transistor M2 are turned ON and the third transistor M3 is turned OFF, while during the second half of the switching cycle, the first transistor M1 is turned OFF, the second transistor M2 is turned ON and the third transistor M3 is fully turned ON. Thus, a voltage VCOM at the common terminal COMM can be expressed as:

$$VCOM = VOUT + IM2 \times RM3 \tag{1}$$

In the above expression (1), the item IM2 represents a current through the second transistor M2 and the third transistor M3, and the item RM3 represents the on-resistance of the third transistor M3. The switching voltage VSW at the switching terminal SW can be expressed as:

$$VSW = VCOM + IM2 \times RM2 = VOUT + IM2 \times RM3 + IM2 \times RM2 \tag{2}$$

In the above expression (2), the item RM2 represents the on-resistance of the second transistor M2. The condition for converter 20 to work in buck operation mode is that the switching voltage VSW should be higher than the input voltage VIN when the first transistor M1 is turned OFF (when the first transistor M1 is turned OFF, if the switching voltage VSW is lower than the input voltage VIN, the inductor current IL1 will increase continuously resulting in the converter 20 operating abnormally), that is:

$$VIN < VOUT + IM2 \times RM3 + IM2 \times RM2 \quad (3)$$

Persons of ordinary skill in the art can adjust the on-resistance of the second transistor M2 reasonably based on the input voltage VIN, the output voltage VOUT, a load current IOUT and the on-resistance of the third transistor M3 so that the converter 20 can operate in buck operation mode normally. For example, the second transistor M2 may comprise N cell transistors, referred to as the first to the $N^{th}$ cell transistors, all connected in parallel, wherein N is an integer larger than 1. During a first time period T1 after the first transistor M1 is turned OFF (or the third transistor M3 is turned ON), if the switching voltage VSW of the converter 20 is lower than a set voltage VSET (e.g., if the switching voltage VSW is lower than the input voltage VIN in an embodiment where the set voltage VSET is set to the input voltage VIN), increase the on-resistance of the second transistor M2 by turning OFF the first cell transistor among the N cell transistors. According to the above formula (2), due to the increase of the on-resistance of the second transistor M2, the switching voltage VSW also increases, making the switching voltage VSW to meet the requirement of formula (3). Thus, the inductor current IL1 of the first inductor L1 can be decreased, so that converter 20 can operate in buck operation mode normally. In another embodiment, after turning the first cell transistor OFF, the on-resistance of the second transistor M2 is still not high enough and the switching voltage VSW cannot even meet the requirement of formula (3). Thus, other cell transistors among the N cell transistors may need to be turned OFF to further increase the on-resistance of the second transistor M2. For example, during an $(M-1)^{th}$ time period T(M-1) after the first transistor M1 is turned OFF, if the switching voltage VSW of converter 20 is still lower than the set voltage VSET, the $M^{th}$ cell transistor may be turned OFF to further increase the on-resistance of the second transistor M2, wherein M is an integer larger than 1 and smaller than N. In the exemplary embodiments of the present invention, the switching voltage VSW is detected at the moment when the first time period T1 expires after the first transistor M1 is turned OFF (or the third transistor M3 is turned ON) rather than at the moment when the first transistor M1 is being turned OFF (or the third transistor M3 is being turned ON) in order to avoid probable false judgments caused by the burrs in the switching voltage VSW during switching. The first time period T1 can be selected flexibly according to the switching cycle. For example, when the switching cycle is 1 us, the first time period T1 can be 30 ns, 40 ns, 100 ns, etc.

In the following, several exemplary embodiments of the multi-mode power converter with different on-resistance regulation circuits (impedance control circuits) coupled to the second transistor M2 are disclosed. Associated control method to the multi-mode power converter and the on-resistance of the second transistor M2 are disclosed meanwhile. Persons of ordinary skill in the art should understand that the following circuits and methods described are not intended to confine this invention.

Figure 3:
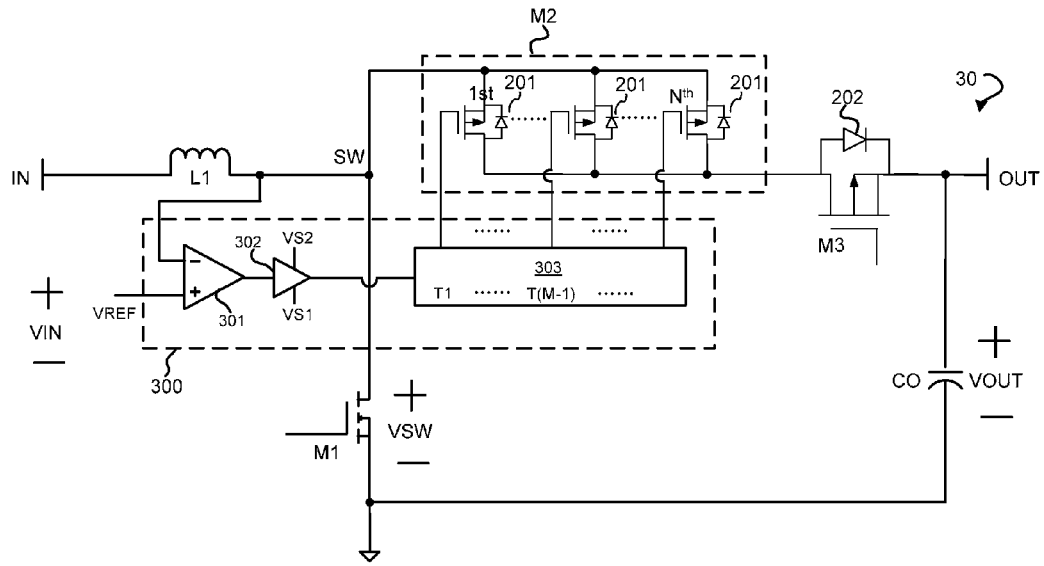
FIG. 3 shows a circuit diagram of a multi-mode power converter 30 according to an embodiment of the present invention.

FIG. 3 shows a circuit diagram of a multi-mode power converter 30 according to an embodiment of the present invention. Compared with the multi-mode power converter 20 shown in FIG. 2, the multi-mode power converter 30 further comprises an impedance control circuit 300 having a first terminal, a second terminal and a third terminal, wherein the first terminal is configured to receive a reference signal VREF (which acts as the set voltage VSET in this example), the second terminal is coupled to the switching terminal SW of the voltage converter 30, and the third terminal is coupled to the control terminal of the second transistor M2. In an embodiment, the input voltage VIN can be used as the reference signal VREF. In other embodiments, the input voltage VIN plus or minus a certain offset voltage VOS (e.g., VIN+2V, if VOS=2V) can be configured as the reference signal VREF. In buck mode, at the moment when the first time period T1 expires after the first transistor M1 is turned OFF, if the switching voltage VSW is lower than the reference signal VREF, the impedance control circuit 300 is configured to increase the on-resistance of the second transistor M2.

In accordance with an embodiment of the present invention, the impedance control circuit 300 may comprise a first comparator 301 and a first driving circuit 302. The first comparator 301 has a first input terminal, a second input terminal and an output terminal, wherein the first input terminal is configured to receive the reference signal VREF and the second input terminal is coupled to the switching terminal SW of converter 30. The first driving circuit 302 has an input terminal and an output terminal, wherein the input terminal of the first driving circuit 302 is coupled to the output terminal of the first comparator 301, and the output terminal of the first driving circuit 302 is coupled to the control terminal of the second transistor M2 to provide a driving signal to the second transistor M2.

In an embodiment, during the first time period T1 after the first transistor M1 is turned OFF, the second transistor M2 may be controlled to have a first on-resistance (typically the minimum on-resistance when the second transistor M2 is fully turned on) by, for example, coupling the first input terminal of the first comparator 301 to a low logic level, coupling the second input terminal of the first comparator 301 to a high logic level and thus forcing the control terminal of the second transistor to have a low logic level. One of ordinary skill in the art should understand that this is not intended to be limiting, other technical schemes may be employed to control the second transistor M2 to have the first on-resistance. When the first time period T1 expires, the forced controlling of the second transistor M2 to have the first on-resistance is removed so that the on-resistance of the second transistor M2 can be regulated according to the operation status of the converter 30. For instance, after the first time T1, if the switching voltage VSW of converter 30 is higher than the reference signal VREF, the first comparator 301 may output a low level signal indicating that the converter 30 is operating in boost mode. Correspondingly, the first driving circuit 302 is configured to output the driving signal with a first voltage level VS1 (e.g., 0 Volts), so as to regulate the second transistor M2 to maintain the first on-resistance (or another predetermined resistance value). In contrast, after the first time T1, first time period T1 if the switching voltage VSW is lower than the reference signal VREF, the first comparator 301 may output a high level signal. Correspondingly, the first driving circuit 302 is configured to output the driving signal with a second voltage level VS2 (e.g., 1, 2 Volts, etc.) higher than the first voltage level VS1. Due to the increase in the voltage level of the driving signal provided to the control terminal of the second transistor M2, the on-resistance of the second transistor M2 is increased accordingly to a second on-resistance higher than the first on-resistance. According to the formula (2), the switching voltage VSW is increased consequently so that the converter 30 can operate in buck mode. One of ordinary skill in the art may sense the input voltage VIN and the switching voltage VSW respectively at the input terminal IN and the switching terminal SW by resistor dividers for example. It can also be understood that the reference signal VREF can be flexibly modified through modifying the offset voltage VOS. For example, if a first resistor divider having a dividing ratio of 9:1 is coupled to the input voltage VIN to provide a first sensed voltage of 0.1*VIN as the reference signal VREF to the first terminal of the first comparator 301a second resistor divider having a dividing ration of 9:1 may also be coupled to the switching terminal SW to provide a second sensed voltage of 0.1*VSW to the second terminal of the first comparator 301. In another example, an offset voltage of 0.2 Volts may be added to the first sensed voltage so that the reference signal VREF is adjusted to a voltage level of (0.1*VIN+0.2). In accordance with an embodiment of the present invention, the first comparator 301 can be a hysteresis comparator having a first threshold and a second threshold with a predetermined hysteresis between the first threshold and the second threshold, wherein the first threshold may act as the reference signal VREF when the switching voltage VSW to be compared increases, and the second threshold may act as the reference signal VREF when the switching voltage VSW to be compared decreases.

Figure 4:
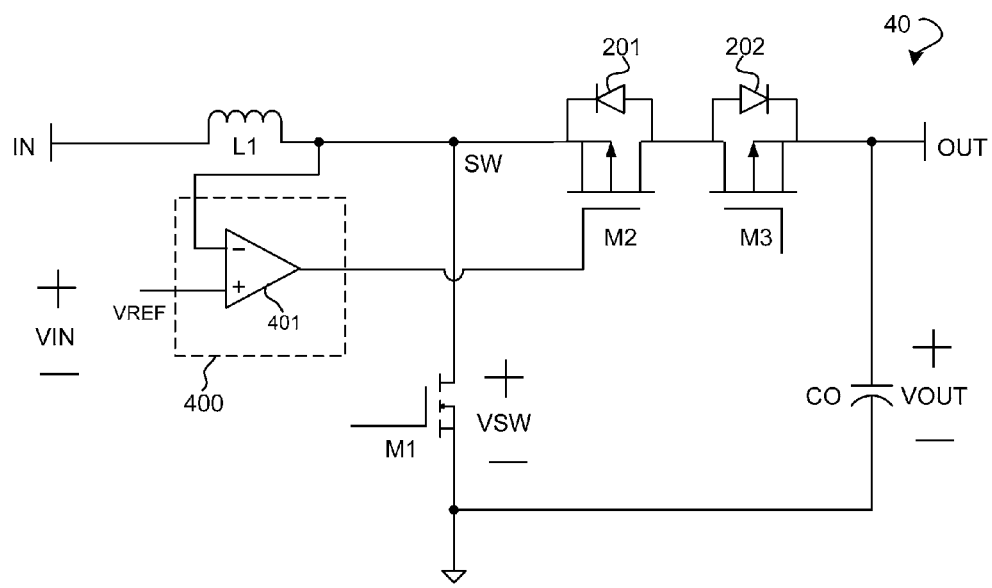
FIG. 4 shows a circuit diagram of a multi-mode power converter 40 according to an embodiment of the present invention.

FIG. 4 shows a circuit diagram of a multi-mode power converter 40 in accordance with an embodiment of the present invention. Compared to the multi-mode power converter 30 shown in FIG. 3, the multi-mode power converter 40 employs an impedance control circuit 400 to take the place of the impedance control circuit 300. The impedance control circuit 400 may comprise a first amplifier 401 having a first input terminal, a second input terminal and an output terminal, wherein the first input terminal is configured to receive the reference signal VREF, the second input terminal is coupled to the switching terminal SW of the converter 40, and the output terminal is coupled to the control terminal of the second transistor M2 to provide a driving signal to the second transistor M2.

In accordance with an embodiment of the present invention, similar as has been described in the embodiment of FIG. 3, the second transistor M2 may be controlled to have the first on-resistance (typically the minimum on-resistance when the second transistor M2 is fully turned on) during the first time period T1 after the first transistor M1 is turned OFF. This may be implemented for example, by coupling the first input terminal of the first amplifier 401 to a low logic level, coupling the second input terminal of the first amplifier 401 to a high logic level and thus forcing the control terminal of the second transistor to have a low logic level. Of course, other technical schemes may be employed to control the second transistor M2 to have the first on-resistance. When the first time period T1 expires, the forced controlling of the second transistor M2 to have the first on-resistance is removed so that the on-resistance of the second transistor M2 can be regulated according to the operation status of the converter 40. For instance, after the first time period T1, if the switching voltage VSW of the converter 40 is higher than the reference signal VREF, the first amplifier 401 may output a low logic level signal indicating that the converter 30 is operating in boost mode, correspondingly the low logic level signal is provided as the driving signal to regulate the second transistor M2 to maintain the first on-resistance (or another predetermined resistance value). In contrast, after the first time period T1, if the switching voltage VSW is lower than the reference signal VREF, the first amplifier 401 may be configured to continuously increase a voltage level of the driving signal output by the first amplifier 401. Due to the increase in the voltage level of the driving signal provided to the control terminal of the second transistor M2, the on-resistance of the second transistor M2 is increased accordingly until the switching voltage VSW is correspondingly increased to reach the set voltage VSET so that the converter 40 can operate in buck mode.

Figure 5:
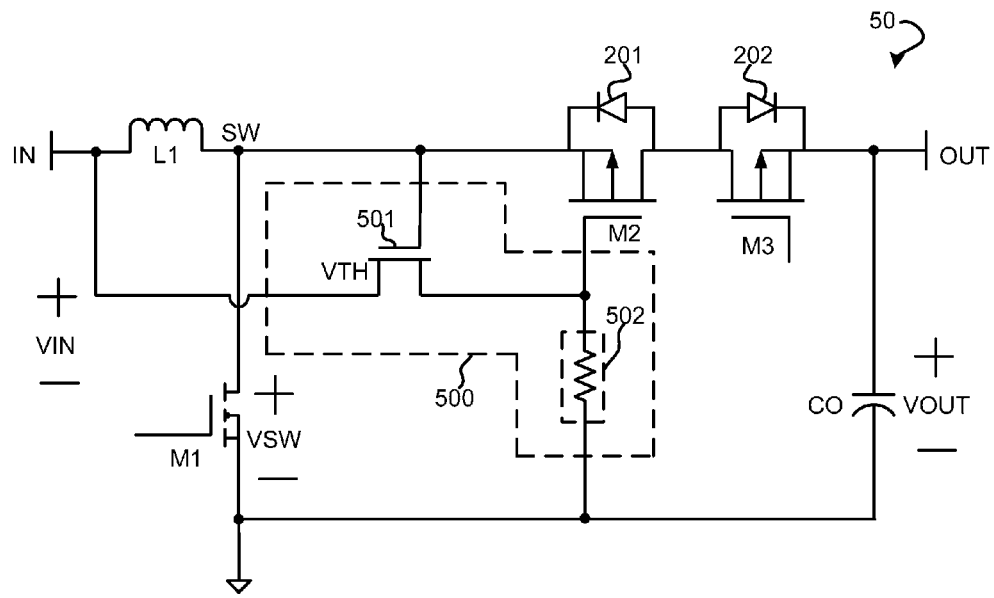
FIG. 5 shows a circuit diagram of a multi-mode power converter 50 according to an embodiment of the present invention.

FIG. 5 shows a circuit diagram of a multi-mode power converter 50 in accordance with an embodiment of the present invention. Compared to the multi-mode power converter 20 as shown in FIG. 2, the multi-mode power converter 50 further comprises an impedance control circuit 500. The impedance control circuit 500 may comprise a fourth transistor 501 and a resistive circuit 502.

The fourth transistor 501 may comprise a depletion mode PMOS having a first terminal, a second terminal and a control terminal, wherein the first terminal is coupled to the input terminal IN of the converter 50, the second terminal is coupled to the control terminal of the second transistor M2, and the control terminal is coupled to the switching terminal SW of converter 50. The resistive circuit 502 has a first terminal and a second terminal, wherein the first terminal is coupled to the control terminal of the second transistor M2, and the second terminal is coupled to the ground terminal GND. The resistive circuit 502 is configured to discharge the control terminal of the second transistor M2. In an example, the resistive circuit 502 can be implemented by a resistor R1 or a current sink, etc.

Assuming that the threshold voltage of the fourth transistor 501 is VTH, for a depletion mode PMOS, the threshold voltage VTH is higher than zero, thus, the depletion mode PMOS transistor 501 cannot switch from ON to OFF until the switching voltage VSW is increased to a voltage level of VIN+|VTH| (which is configured as the set voltage VSET in this example). In the current exemplary embodiment shown in FIG. 5, after the first transistor M1 is turned OFF (or the third transistor M3 is turned ON), the switching voltage VSW begins to rise. During a first time period T1 after the first transistor M1 is turned OFF, the second transistor M2 may be controlled to have the first on-resistance (typically the minimum on-resistance when the second transistor M2 is fully turned on) by coupling the control terminal of the second transistor M2 to a low logic level or by other technical schemes. That is to say, during the first time period T1 after the first transistor M1 is turned OFF, the second transistor M2 may be forced to maintain the first on-resistance. When the first time period T1 expires, the forced controlling of the second transistor M2 to have the first on-resistance is removed so that the on-resistance of the second transistor M2 can be regulated according to the operation status of the converter 50. For instance, after the first time period T1, if the switching voltage VSW of the converter 50 is higher than VIN+|VTH| (i.e., the set voltage VSET which is set to VIN+|VTH| in this example), the fourth transistor 501 is OFF and the resistive circuit 502 discharges the control terminal of the second transistor M2 to a relatively low voltage, and the converter 50 operates in boost mode. If the switching voltage VSW of the converter 50 is lower than VIN+|VTH| (i.e., the set voltage VSET which is set to VIN+|VTH| in this example), the fourth transistor 501 is ON and charges the control terminal of the second transistor M2 to increase a control voltage at the control terminal of the second transistor M2. Due to the increase in the control voltage at the control terminal of the second transistor M2, the on-resistance of the second transistor M2 increases. According to the formula (2), the switching voltage VSW may be increased to about VIN+|VTH| so that the converter 50 can operate in buck mode.

When the first transistor M1 is turned ON, the switching voltage VSW is relatively low and a current flowing from the first terminal to the second terminal of the fourth transistor 501 is relatively high, resulting in high power consumption and probably false triggering. For example, immediately after the first transistor M1 is turned OFF and before the switching voltage VSW is increased to a high enough voltage value, the current flowing through the fourth transistor 501 is still relatively high, thus the control voltage at the control terminal of the second transistor M2 is relatively high resulting in increase in the on-resistance of the second transistor M2, which in turn causing the switching voltage VSW to rise, leading to inaccurate judgment of the switching voltage VSW by the impedance control circuit 500. A current limit circuit may be provided to limit the current from the first terminal to the second terminal of the fourth transistor 501 when the first transistor M1 is ON or during the first time period T1 after the first transistor M1 is turned OFF.

Figure 6:
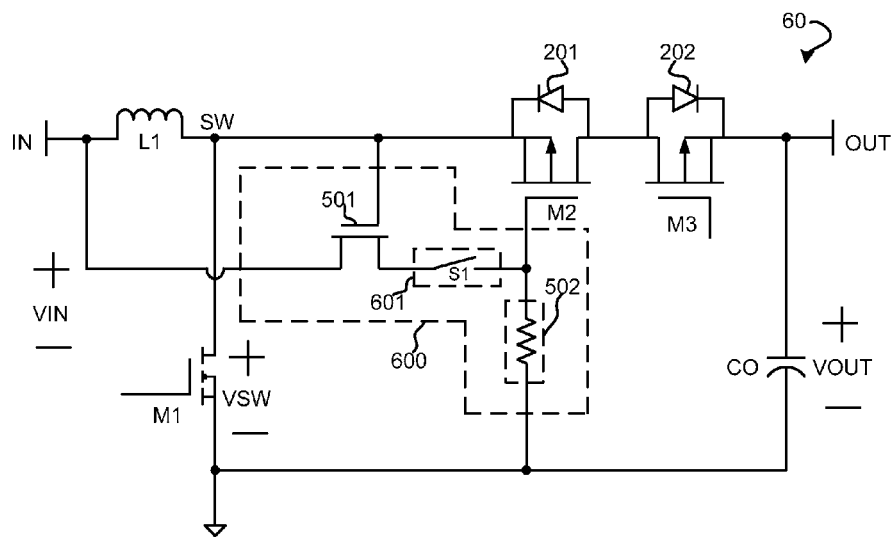
FIG. 6 shows a circuit diagram of a multi-mode power converter 60 according to an embodiment of the present invention.

FIG. 6 shows a circuit diagram of a multi-mode power converter 60 in accordance with an embodiment of the present invention. Compared to the multi-mode power converter 50 as shown in FIG. 5, the multi-mode power converter 60 comprises an impedance control circuit 600 which takes the place of the impedance control circuit 500. The impedance control circuit 600 may comprise a fourth transistor 501, a current limit circuit 601 and a resistive circuit 502.

The fourth transistor 501 may comprise a depletion mode PMOS having a first terminal, a second terminal and a control terminal, wherein the first terminal is coupled to the input terminal IN of the converter 60, the second terminal is coupled to an input terminal of the current limit circuit 601, and the control terminal is coupled to the switching terminal SW of converter 60. An output terminal of the current limit circuit 601 is coupled to the control terminal of the second transistor M2. The current limit circuit 601 is configured to limit the current flowing from the first terminal to the second terminal of the fourth transistor 501 when the first transistor M1 is ON and during the first time period T1 after the first transistor M1 is turned OFF. In accordance with an embodiment of the present invention, the current limit circuit 601 may comprise a switch S1. In other embodiments, the current limit circuit 601 may be implemented by a transistor operated in saturation or linear region. The resistive circuit 502 has a first terminal and a second terminal, wherein the first terminal is coupled to the control terminal of the second transistor M2 and the second terminal is coupled to the ground terminal GND. The resistive circuit 502 is configured to discharge the control terminal of the second transistor M2.

Figure 7:
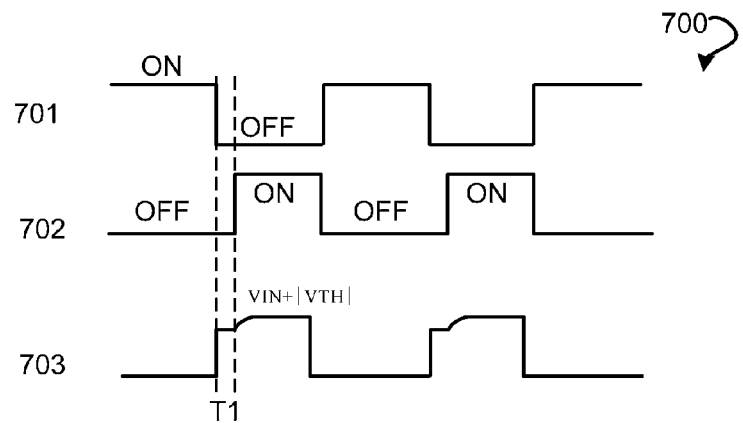
FIG. 7 shows an operating waveform diagram 700 of the multi-mode power converter 60 according to an embodiment of the present invention.

FIG. 7 shows an operating waveform diagram 70 of the multi-mode power converter 60 according to an embodiment of the present invention. According to an embodiment of the present invention, the first switch S1 is turned ON at the moment when the first time period T1 expires after the first transistor M1 is turned OFF and is turned OFF before the first transistor M1 is turned ON. The waveform 701 illustrates the ON and OFF switching of the first transistor M1 while the waveform 702 illustrates the ON and OFF switching of the first switch S1. The first transistor M1 and the first switch S1 may be respectively controlled by a first clock signal and a second clock signal without overlapping with each other. The first clock signal and the second clock signal may be a pair of non-overlapping clock signals generated from a switching signal processed by a dead-time generation circuit. In this fashion, since the first switch S1 is turned OFF during the first transistor M1 is ON, the current flowing through the fourth transistor 501 is actually cut off in this example by the first switch S1 (i.e. the current limit circuit 601), which means that the current flowing through the fourth transistor 501 is effectively limited. Thus, power consumption and the energy dissipation can be effectively reduced. During the first time period T1 after the first transistor M1 is turned OFF, the first switch S1 is kept OFF, and the resistive circuit 502 can discharge the control terminal of the second transistor M2 to a relatively low voltage so that the second transistor M2 has a lower on-resistance to avoid mis-triggering of the regulation of the on-resistance of the second transistor. After the first time period T1, the first switch S1 is turned ON. In this circumstance, if the switching voltage VSW of the converter 60 is higher than VIN+|VTH| (i.e., the set voltage VSET which is set to VIN+|VTH| in this example), the fourth transistor 501 is OFF and the resistive circuit 502 discharges the control terminal of the second transistor M2 to a relatively low voltage, and the converter 60 operates in boost mode. In contrast, if the switching voltage VSW of the converter 60 is lower than VIN+|VTH| (i.e., the set voltage VSET which is set to VIN+|VTH| in this example), as illustrated by the waveform 703, the fourth transistor 501 is ON and thus the control terminal of the second transistor M2 can be charged by the input voltage VIN of the converter 60. Accordingly, the control voltage at the control terminal of M2 increases and regulates the on-resistance of the second transistor M2 to increase. According to formula (2), the switching voltage VSW also increases with the increase in the on-resistance of the second transistor M2 until it reaches the set voltage VSET (which can be VIN+|VTH| in this example) so that the converter 60 can operate in buck mode.

In the example shown in FIG. 6, the current limit circuit 601 is coupled between the second terminal of the fourth transistor 501 and the control terminal of the second transistor M2. In another embodiment, the current limit circuit 601 may be coupled between the first terminal of the fourth transistor 501 and the switching terminal SW of the converter 60. In still another embodiment, the current limit circuit 601 may be coupled between the control terminal and the second terminal of the fourth transistor 501. One of ordinary skill in the art would understand that in theses alternative embodiments, the operating principles of the current limit circuit 601 and the impedance control circuit 600 are similar as those just described with reference to FIG. 6 and FIG. 7.

Figure 8:
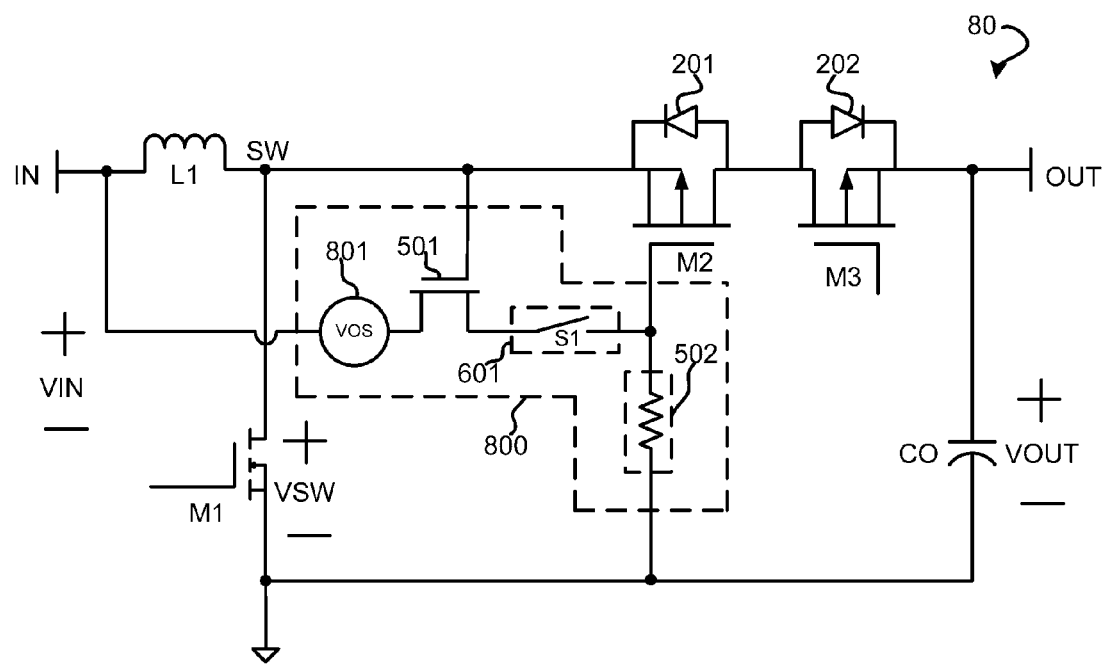
FIG. 8 shows a circuit diagram of a multi-mode power converter 80 according to an embodiment of the present invention.

FIG. 8 shows a circuit diagram of a multi-mode power converter 80 in accordance with an embodiment of the present invention. Compared to the multi-mode power converter 60 as shown in FIG. 6, in the multi-mode converter 80, an impedance control circuit 800 takes the place of the impedance control circuit 600. The impedance control circuit 800 may comprise an offset circuit 801, the fourth transistor 501, the current limit circuit 601 and the resistive circuit 502.

In the power converter 80 as shown in FIG. 8, the fourth transistor 501 may be a depletion mode PMOS transistor, thus so the fourth transistor 501 can be turned OFF when the switching voltage VSW is higher than the set voltage VSET which can be VIN+|VTH| in this example. In other embodiments, however, the fourth transistor 501 may be implemented by an enhancement mode PMOS transistor or a bipolar PNP transistor due to the addition of the offset circuit 801 in the impedance control circuit 800 compared to the impedance control circuit 600.

The offset circuit 801 may have a first terminal and a second terminal, wherein the first terminal is coupled to the input terminal IN of the converter 80 and the second terminal is coupled to a first terminal of the fourth transistor 501. The offset circuit 801 is configured to generate an offset voltage VOS based on the input voltage VIN. The fourth transistor 501 may be a PMOS or a PNP transistor with a control terminal being coupled to the switching terminal SW of the converter 60 and a second terminal being coupled to the control terminal of the second transistor M2.

With the employment of the offset circuit 801, for an embodiment wherein the fourth transistor 501 is implemented by an enhancement mode PMOS, the threshold voltage VTH of the fourth transistor 501 is lower than zero. Thus, the enhancement mode PMOS (i.e. the fourth transistor 501 in this example) can be switched from ON to OFF when the switching voltage VSW is increased to a voltage level of VIN+VOS−|VTH| (i.e. the set voltage VSET in this example). However, in an embodiment wherein the fourth transistor 501 is implemented by depletion mode PMOS, the threshold voltage VTH of the fourth transistor 501 is higher than zero. Thus, the depletion mode PMOS (i.e. the fourth transistor 501 in this example) cannot be switched from ON to OFF until the switching voltage VSW is increased to a voltage level of VIN+VOS+|VTH| (i.e. the set voltage VSET in this example). Alternatively, in an embodiment wherein the further transistor 501 is implemented by a PNP transistor, the switching voltage VSW should be increased to a voltage level of VIN+VOS−|VBE| (i.e. the set voltage VSET in this example) to switch the PNP transistor from ON to OFF, wherein the symbol VBE represents a base to emitter forward conduction threshold of the PNP transistor. Persons skilled in the art may select appropriate type of transistor to implement the fourth transistor 501 and configure the offset circuit 801 reasonably to adjust the set voltage VSET according to different application requirements.

The offset circuit 801 is not limited to be coupled between the input terminal IN and the first terminal of the fourth transistor 501. For instance, in another embodiment, the offset circuit 801 may be coupled between the switching terminal SW of the converter 80 and the control terminal of the fourth transistor 501. In such an alternative embodiment, the operating principles of the impedance control circuit 800 are similar to those of the impedance control circuit 800 described with reference to FIG. 8.

Figure 9:
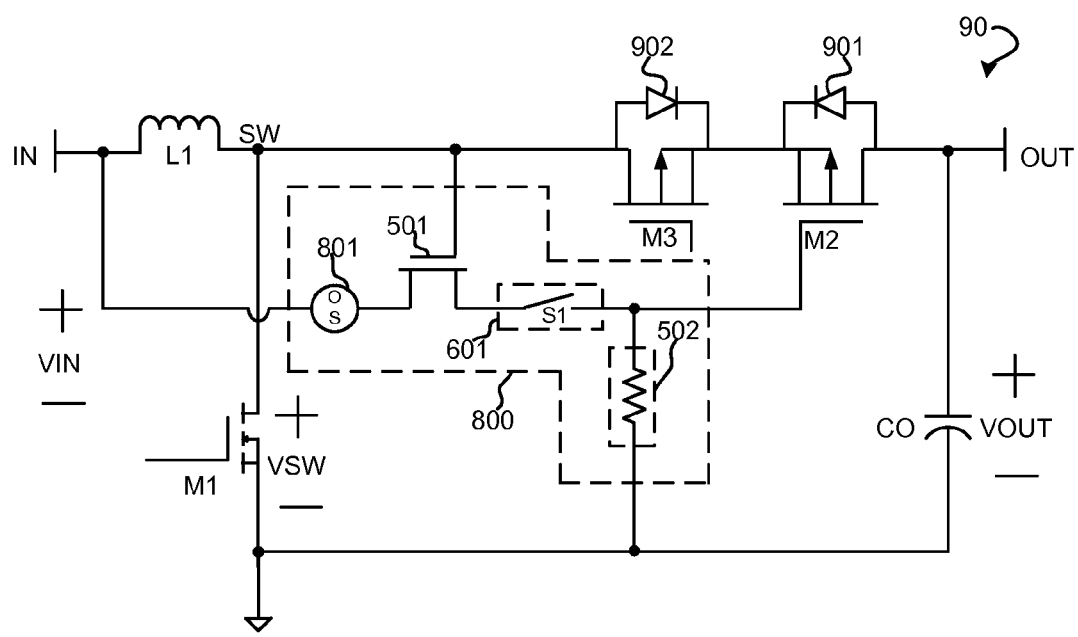
FIG. 9 shows a circuit diagram of a multi-mode power converter 90 according to an embodiment of the present invention.

FIG. 9 shows a circuit diagram of a multi-mode power converter 90 in accordance with an embodiment of the present invention. Compared to the multi-mode power converter 80 as shown in FIG. 8, in the multi-mode power converter 90, the second transistor M2 and the third transistor M3 may both be implemented by PMOS and may be coupled between the switching terminal SW and the output terminal OUT in series, wherein the bodies of the second transistor M2 and the third transistor M3 are coupled to a common connection COMM of the second transistor M2 and the third transistor M3. Namely, the anode of a body diode 901 of the second transistor M2 is coupled to the output terminal OUT of the power converter 90, and the cathode of the body diode 901 is coupled to the common connection COMM. The anode of a body diode 902 of the third transistor M3 is coupled to the switching terminal SW, and the cathode of the body diode 902 is coupled to the common connection COMM. With the teachings of the present disclosure, persons of ordinary skill in the art may be able to make various modifications to the implementation and configuration of the second transistor M2 and the third transistor M3. For instance, in an alternative embodiment, the second transistor M2 and the third transistor M3 may both comprise N-type channel metal oxide semiconductor field effect transistors ("NMOS") coupled between the switching terminal SW and the output terminal OUT in series. In another alternative embodiment, the second transistor M2 and the third transistor M3 may respectively comprise an NMOS and a PMOS coupled between the switching terminal SW and the output terminal OUT in series, provided that an anode of a body diode of the NMOS and an anode of a body diode of the PMOS are both coupled to a common connection of the NMOS and the PMOS, or a cathode of the body diode of the NMOS and a cathode of the body diode of the PMOS are both coupled to the common connection of the NMOS and the PMOS.

While specific embodiments of the present invention have been described above, it is to be understood that these embodiments are for illustration purposes and not limiting. Many additional embodiments, alternative options, modification or transformation will be apparent to persons of ordinary skill in the art reading this disclosure.

I claim:

1. A multi-mode power converter comprising:
an input port;
an output port;
a switching terminal coupled to the input port through an inductive element;
a first transistor coupled between the switching terminal and a ground;
a second transistor and a third transistor coupled in series between the switching terminal and the output port; wherein
the multi-mode power converter has a boost operation mode and a buck operation mode; and wherein
in the boost operation mode, the second transistor is ON while the first transistor and the third transistor are switched ON and OFF complementarily, or the second transistor and the third transistor are switched ON and OFF substantially simultaneously while the first transistor and the third transistor are switched ON and OFF complementarily; and wherein
in the buck operation mode, the second transistor is ON while the first transistor and the third transistor are switched ON and OFF complementarily, and wherein an on-resistance of the second transistor is regulated to ensure the multi-mode power converter operates normally in the buck operation mode.

2. The multi-mode power converter of claim 1, wherein the second transistor and the third transistor has a common connection and respectively has a first body diode and a second body diode, and wherein either an anode of the first body diode and an anode of the second body diode are connected to the common connection or a cathode of the first body diode and a cathode of the second body diode are connected to the common connection.

3. The multi-mode power converter of claim 2, wherein the second transistor and the third transistor comprise P channel metal oxide field effect transistors.

4. The multi-mode power converter of claim 1, further comprising:

an impedance control circuit having a first terminal, a second terminal and a third terminal, wherein the first terminal is configured to receive a reference signal, the second terminal is coupled to the switching terminal of the multi-mode power converter to sense a switching voltage at the switching terminal and provide a sensed switching voltage, and the third terminal is coupled to the control terminal of the second transistor; and wherein the impedance control circuit is configured to regulate the on-resistance of the second transistor to increase if the sensed switching voltage is lower than the reference signal after a first time period since the moment when the first transistor is switched OFF.

5. The multi-mode power converter of claim 4, wherein the impedance control circuit is further configured to regulate the on-resistance of the second transistor to maintain at a first on-resistance during the first time period since the moment when the first transistor is switched OFF.

6. The multi-mode power converter of claim 4, wherein the reference signal is equal to or higher than an input voltage provided to the input port of the multi-mode power converter.

7. The multi-mode power converter of claim 4, wherein the impedance control circuit comprises:
 a comparator configured to receive the reference signal and the sensed switching voltage respectively, and to compare the sensed switching voltage with the reference signal to provide a comparison signal; and
 a driving circuit configured to receive the comparison signal and to provide a driving signal based on the comparison signal to the control terminal of the second transistor; wherein
 during the first time period since the moment when the first transistor is switched OFF, the driving signal is configured to maintain the on resistance of the second transistor at a first on-resistance; and wherein
 after the first time period, if the sensed switching voltage is lower than the reference signal, the driving signal is configured to regulate the on-resistance of the second transistor to increase from the first on-resistance to a second on-resistance.

8. The multi-mode power converter of claim 4, wherein the impedance control circuit comprises:
 an operational amplifier configured to receive the reference signal and the sensed switching voltage respectively, and to provide a driving signal based on the reference signal and the sensed switching voltage to the control terminal of the second transistor; wherein
 during the first time period since the moment when the first transistor is switched OFF, the driving signal is configured to maintain the on resistance of the second transistor at a first on-resistance; and wherein
 after the first time period, if the sensed switching voltage is lower than the reference signal, the driving signal is configured to regulate the on-resistance of the second transistor to increase linearly from the first on-resistance to a second on-resistance.

9. The multi-mode power converter of claim 4, wherein the impedance control circuit comprises:
 a fourth transistor having a first transistor terminal, a transistor control terminal and a second transistor terminal, wherein the first transistor terminal is configured to receive the reference signal, the transistor control terminal is configured to receive the sensed switching voltage, and the second transistor terminal is coupled to the control terminal of the second transistor; and a resistive circuit having a first terminal coupled to the control terminal of the second transistor, and a second terminal coupled to the ground, and configured to discharge the control terminal of the second transistor; wherein
 during the first time period since the moment when the first transistor is switched OFF, the fourth transistor is OFF so that the control terminal of the second transistor is forced to have a predetermined control voltage to maintain the on resistance of the second transistor at a first on-resistance; and wherein
 after the first time period, if the sensed switching voltage is lower than the reference signal, the fourth transistor is ON and configured to charge the control terminal of the second transistor to increase the on-resistance of the second transistor.

10. The multi-mode power converter of claim 9, wherein the fourth transistor comprises a depletion mode P channel metal oxide field effect transistor, and wherein the first transistor terminal of the fourth transistor is coupled to the input port to receive an input voltage of the multi-mode power converter, and wherein the input voltage plus an absolute value of a threshold voltage of the fourth transistor is equivalent to the reference signal.

11. The multi-mode power converter of claim 9, wherein the fourth transistor comprises an enhancement mode P channel metal oxide field effect transistor or a bipolar PNP transistor; and wherein
 the impedance control circuit further comprises an offset circuit configured to provide an offset voltage; and wherein
 the first transistor terminal of the fourth transistor is coupled to the input port of the multi-mode power converter through the offset circuit, wherein an input voltage provided to the input port plus the offset voltage and minus an absolute value of a threshold voltage of the fourth transistor is equivalent to the reference signal.

12. The multi-mode power converter of claim 9, wherein the fourth transistor comprises an enhancement mode P channel metal oxide field effect transistor or a bipolar PNP transistor; and wherein
 the impedance control circuit further comprises an offset circuit configured to provide an offset voltage; and wherein
 the first transistor terminal of the fourth transistor is coupled to the input port of the multi-mode power converter, and the transistor control terminal of the fourth transistor is coupled to the sensed switching voltage through the offset circuit, wherein an input voltage provided to the input port plus the offset voltage and minus an absolute value of a threshold voltage of the fourth transistor is equivalent to the reference signal.

13. The multi-mode power converter of claim 9, wherein the impedance control circuit further comprises:
 a current limit circuit coupled between the second transistor terminal of the fourth transistor and the control terminal of the second transistor, or coupled between the first transistor terminal of the fourth transistor and the switching terminal of the multi-mode power converter, wherein the current limit circuit is configured to limit a current flowing from the first transistor terminal to the second transistor terminal of the fourth transistor when the first transistor is ON and during the first time period since the first transistor is turned OFF.

14. The multi-mode power converter of claim 13, wherein the current limit circuit comprises a switch, and wherein the switch is turned ON at the moment when the first transistor is turned OFF and is turned OFF before the first transistor is turned ON.

15. A method for controlling a multi-mode power converter having a boost operation mode and a buck operation mode, comprising:
- coupling a switching terminal of the multi-mode power converter to an input port through an inductive element;
- coupling a first transistor between the switching terminal and a ground;
- coupling a second transistor and a third transistor in series between the switching terminal and an output port;
- in the boost operation mode, keeping the second transistor ON while switching the first transistor and the third transistor ON and OFF complementarily, or switching the second transistor and the third transistor ON and OFF substantially simultaneously while switching the first transistor and the third transistor ON and OFF complementarily; and
- in the buck operation mode, keeping the second transistor ON while switching the first transistor and the third transistor ON and OFF complementarily and regulating an on-resistance of the second transistor to ensure the multi-mode power converter operates normally in the buck operation mode.

16. The method of claim 15, wherein the second transistor and the third transistor has a common connection and respectively has a first body diode and a second body diode, and wherein the method further comprising:
- either connecting an anode of the first body diode and an anode of the second body diode to the common connection or connecting a cathode of the first body diode and a cathode of the second body diode to the common connection.

17. The method of claim 15, further comprising:
- sensing a switching voltage at the switching terminal of the multi-mode power converter to provide a sensed switching voltage;
- after a first time period since the moment when the first transistor is switched OFF, identifying whether the sensed switching voltage is lower than a reference signal; and
- if the sensed switching voltage is lower than the reference signal, regulating the on-resistance of the second transistor to increase.

* * * * *